United States Patent [19]

Payne et al.

[11] 4,120,744
[45] Oct. 17, 1978

[54] METHOD OF FABRICATING A THERMAL DISPLAY DEVICE

[75] Inventors: Thomas R. Payne, Plano; Harry K. James; Millard M. Judy, both of Dallas, all of Tex.

[73] Assignee: Texas Instruments Incorporated, Dallas, Tex.

[21] Appl. No.: 383,411

[22] Filed: Jul. 26, 1973

Related U.S. Application Data

[63] Continuation of Ser. No. 156,756, Jun. 25, 1971, abandoned.

[51] Int. Cl.² .................................... H01L 21/306
[52] U.S. Cl. .............................. 156/653; 148/187; 156/657; 156/662; 357/50
[58] Field of Search ................. 156/3, 17, 656, 657, 156/662, 636, 653; 29/577, 578, 580, 573, 583, 589; 148/174, 187; 117/212; 357/50

[56] References Cited

U.S. PATENT DOCUMENTS

| | | | |
|---|---|---|---|
| 3,559,283 | 2/1971 | Kravitz | 156/17 |
| 3,587,166 | 6/1971 | Alexander et al. | 156/17 |
| 3,623,218 | 11/1971 | Mitarai et al. | 156/17 |
| 3,677,848 | 7/1972 | Stoller et al. | 156/17 |
| 3,689,357 | 9/1972 | Jordan | 156/17 |
| 3,716,425 | 8/1970 | Davidson | 156/17 |
| 3,725,160 | 4/1973 | Bean et al. | 156/17 |
| 3,728,179 | 4/1973 | Davidson et al. | 156/17 |
| 3,755,012 | 8/1973 | George et al. | 156/17 |

Primary Examiner—William A. Powell
Assistant Examiner—Jerome W. Massie
Attorney, Agent, or Firm—James T. Comfort; Gary C. Honeycutt

[57] ABSTRACT

A plurality of silicon elements are arranged in a printing array with the major faces co-planar and the edges interconnected into a monolithic structure by a grid of polycrystalline silicon and silicon dioxide. The silicon dioxide provides an electrical and thermal barrier, and the polycrystalline silicon provides a strong mechanical interconection. In the preferred embodiment, the silicon elements are monocrystalline and contain one or more electrical components for selectively heating the elements.

The method for fabricating the device includes the steps of etching V-shaped grooves in one surface of a silicon slice and then successively growing silicon dioxide and polycrystalline silicon on the etched surface to form a thick slice. The other side of the slice is then lapped away to at least the depth of the silicon dioxide in the grooves and semiconductor elements and conductors formed in and/or on the lapped side. The lapped side is then bonded to a substrate and the polycrystalline silicon and silicon dioxide removed from the surfaces of the elements, but not from the grooves between the elements. The elements are thus part of a monolithic sheet having sufficient structural integrity to withstand thermal fracturing without producing print smearing from element to element.

4 Claims, 20 Drawing Figures

METHOD OF FABRICATING A THERMAL DISPLAY DEVICE

This is a continuation, of application Ser. No. 156,756, filed June 25, 1971, now abandoned.

This invention relates generally to display devices, and more particularly relates to an improved thermal display having increased mechanical stability.

Thermal display devices such as thermal printers have heretofore been manufactured which comprise a plurality of discrete monocrystalline semiconductor mesas mounted on a ceramic substrate by an epoxy in a four-by-five or a five-by-seven array. Electrical heating means are formed either within the individual mesas or on the surfaces of the mesas adjacent the substrate. Very thin metallic films are bonded to the surfaces of the mesas adjacent the substrate and extend over the spaces or moats between the mesas to the heater means of the mesas.

When a mesa is selectively energized, it may reach a temperature of 250° C compared with a temperature of only about 25° C when not energized. Since the epoxy has a relatively high thermal expansion coefficient, the epoxy under the heated mesa will expand significantly more than the epoxy under the adjacent mesa which is not energized. This results in severe stresses upon the metallic leads extending between the mesas which often causes the leads to break, thus causing failure of the entire array. Other failures result when particles from thermally sensitive paper disposed adjacent the faces of the mesas enter the spaces between the mesas and mechanically abrade the silicon dioxide upon which the metallic leads are deposited until the leads fail. Repeated efforts to mechanically interconnect the mesas in a manner to prevent failure by these modes have heretofore been unsuccessful. The problem is made more difficult because it is necessary to keep adjacent mesas both electrically and thermally isolated.

In accordance with this invention, a thermal display device is provided comprised of a plurality of heater elements disposed in a generally planar array with the peripheral edges of the elements spaced apart. An interconnection means is disposed between the elements which mechanically interconnects the elements into a monolithic structure that is resistant to fracturing by thermally induced stress, erosion by abrasion, and yet has electrical and thermal impedances sufficiently large to prevent electrical and thermal interaction between the elements.

In the preferred form of the invention, the heater elements are fabricated from a semiconductor material, and the interconnection means comprises a body of semiconductor material connected to and separated from each of the elements by a layer of an oxide of the semiconductor material. The semiconductor materials are both typically silicon, and the oxide is typically silicon dioxide, although other semiconductor materials and other crystalline materials may also be employed.

In accordance with the method of the present invention, a grid of grooves are formed in one face of a slice of semiconductor material to form an array of mesas separated one from the other by moats. An adherent layer of oxide is formed on the face of the mesas and in the grooves. This oxide layer is made sufficiently thick to provide a significant thermal barrier. A layer of semiconductor material is then deposited on the layer of oxide to a depth sufficient to provide mechanical stability for further processing of the opposite side of the slice of semiconductor material. The opposite side of the slice of semiconductor material is then lapped away to the bottoms of the moats. Electrical heater elements are then formed on the lapped face and the lapped face bonded to a substrate. Then both the layer of semiconductor material and the layer of oxide are selectively removed from the faces of the mesas, but not from the bottoms of the moats. This leaves a monolithic structure which very effectively resists thermally and mechanically induced fractures, yet which provides good thermal and electrical isolation between the mesas because of the silicon dioxide. In accordance with more specific aspects of the invention, alternative methods are provided for removing the layer of semiconductor material and the layer of oxide from the mesa tops, while leaving the layers in the moats.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
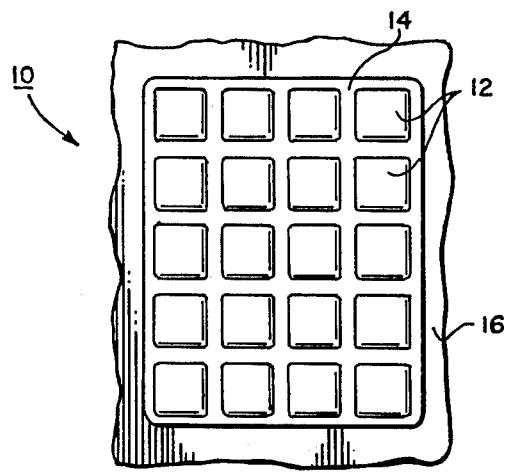
FIG. 1 is a plan view of a thermal display device in accordance with the present invention.
Figure 8:
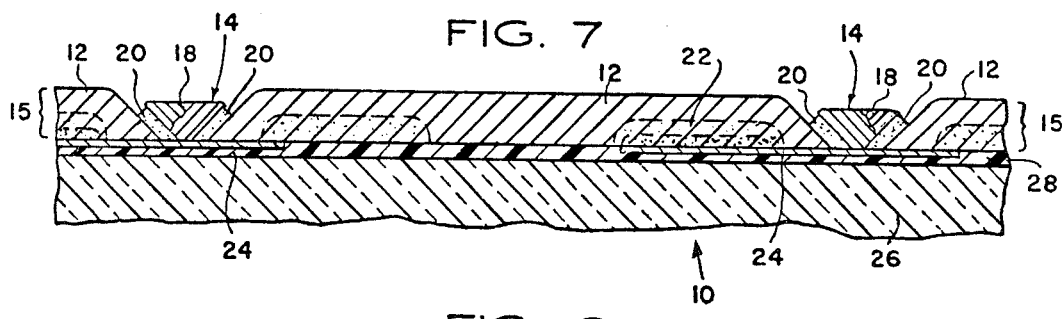

Referring now to the drawings, and in particular to FIGS. 1 and 8, a thermal display device in accordance with the present invention is indicated generally by the reference numeral 10. The display device 10 comprises a plurality of semiconductor mesas 12 disposed in a four-by-five array. Each of the mesas 12 is comprised of a thin slice of monocrystalline silicon or other semiconductor material, typically 1.5 mils thick. Each of the mesas 12 have parallel major faces, and the major faces of all of the mesas are disposed in a pair of parallel planes. The mesas are typically 15 × 16 mil rectangles separated by moats about 4 mils wide.

The edges of the mesas 12 adjacent the moats are interconnected one to the other and to a peripheral frame of semiconductor material 16 by a grid of material 14 to form a monolithic sheet 15 as shown in the sectional view of FIG. 8. The material 14 comprises a grid shaped body of polycrystalline silicon 18, or other suitable semiconductor material, which is intimately bonded to each of the mesas 12 by relatively thick layers of silicon dioxide 20, or an oxide of the particular semiconductor material used for the mesas 12. The silicon dioxide 20 is of sufficient thickness to provide a significant thermal impedance between adjacent mesas 12, and also provides electrical isolation between adjacent mesas 12. The silicon dioxide layer 20 is typically from 40,000 to 100,000 Angstrom units thick.

The heater means for each of the mesas 12 of the monolithic slice 15 typically is a diffused heater transistor indicated generally by the reference numeral 22. The mesa forms the collector region and the base and emitter regions are diffused. A very thin oxide is formed over the bottom face of the monolithic sheet 15 for insulation purposes, and metallic leads represented schematically at 24 are deposited on the bottom surface and make contact with the various active regions of the transistors 20, using techniques conventional in the integrated circuit art. The monolithic slice 15 is bonded to a ceramic substrate 26 by a layer of epoxy 28, or other suitable adhesive. The substrate 26 serves as both a mechanical support and a heat sink.

In the operation of the device 10, the mesas 12 are selectively heated by energizing the transistors 22 of the mesas. Assume that the center mesa in FIG. 8 is energized and the two mesas on either side remain cool. In such a case, the center mesa would be elevated to a temperature of from 250° C to 300° C, while the adjacent mesas would remain at about 25° C. As a result, the epoxy 28 under the heated mesa would expand substantially because of a relatively high coefficient of thermal expansion. The material 14 interconnecting the mesas into the monolithic sheet is sufficiently strong to prevent rupturing of the metallic leads 24 extending between the mesas. This is in contrast to previous devices which were fabricated without the material 14 except for a very thin layer of oxide, which was often not continuous over the metallic films. The material 14 also protects the leads 24 from abrasion by, for example, paper particles which get into the moats when paper is passed over the print head.

One method in accordance with the present invention for fabricating the device 10 is illustrated in FIGS. 2–8. The starting material is typically a slice of silicon indicated generally by the reference numeral 50, which is typically about 16 mils (0.0160 inches) thick. The top surface 52 of the slice is oriented along the [100] plane. The surface 152, which is coated with a thin film of oxide (not illustrated), is coated with a suitable photo-resist 54 which is exposed and developed to expose a grid pattern corresponding generally to the shape of the material 14 in FIG. 1. First, the silicon dioxide and then the silicon is exposed to selective etching solutions which produces a grid of V-shaped grooves or moats 56 and leaves the mesas 12. The side walls of the moats are disposed at approximately 54° to the [100] plane. Different planes of silicon and slice orientations can be used with different etch solutions to give different shaped grooves.

Figure 3:
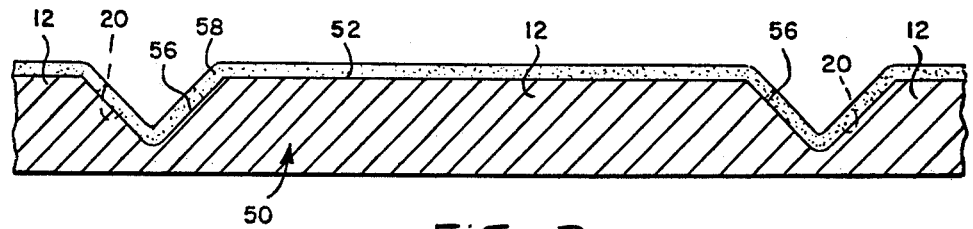
Figure 4:
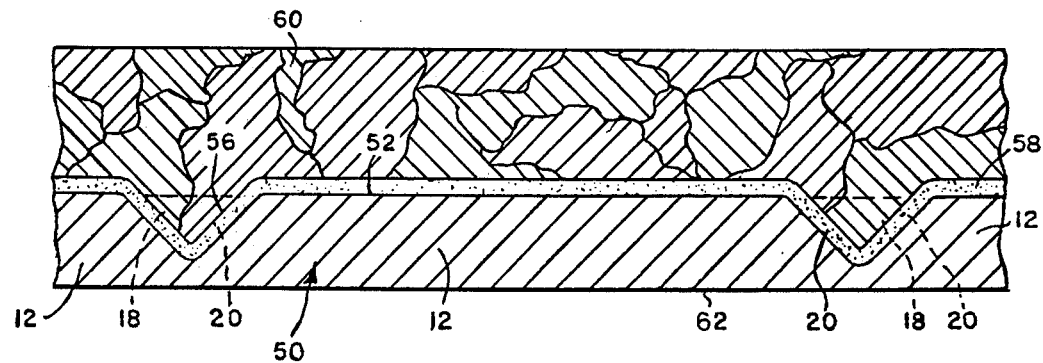

After the photo-resist 54 is striped from the surface 52, the surface is placed in a conventional oxidizing environment to grow a relatively thick layer of silicon dioxide 58 on the tops of the mesas 12 and in the moats 56, as illustrated in FIG. 3. Next, a relatively thick layer 60 of polycrystalline silicon is grown on the oxide layer 58 using any suitable conventional chemical deposition process.

Figure 5:
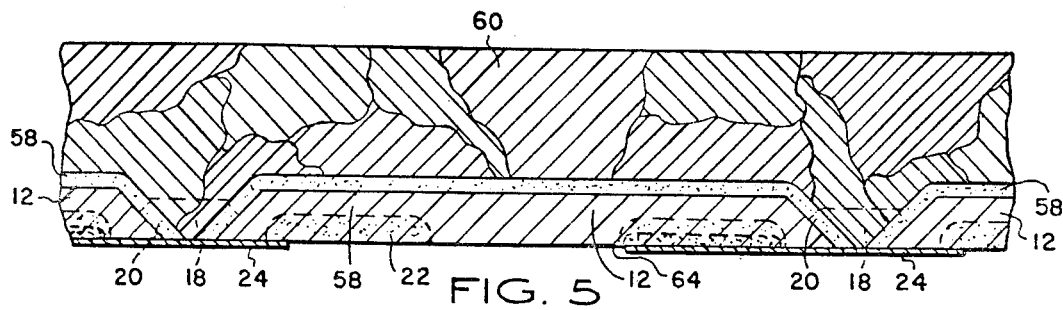
Figure 6:
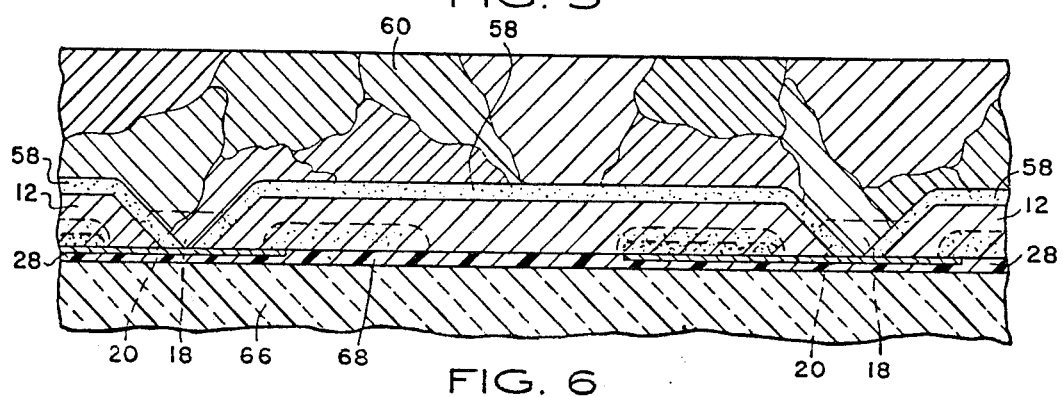

Next, the lower surface 62 of the silicon slice 50 is mechanically ground or lapped away at least to the bottom of the silicon dioxide layer 58 in the moats 56, as is best illustrated by surface 64 in FIG. 5. Then the heater transistors 22 and the metallic leads 24 are formed on the lapped surface 64 using conventional integrated circuit processes. The slice as illustrated in FIG. 5 is then mounted upon a ceramic substrate 66 by an epoxy layer 68 as best illustrated in FIG. 6. The mounting by the epoxy layer 68 is preferably done using the method described in copending U.S. application entitled THERMAL DISPLAY SYSTEM (II-4416), Ser. No. 156,772 filed June 25, 1971 now U.S. Pat. No. 3,808,399, by William W. Boyd et al, and assigned to the assignee of the present invention.

Figure 7:
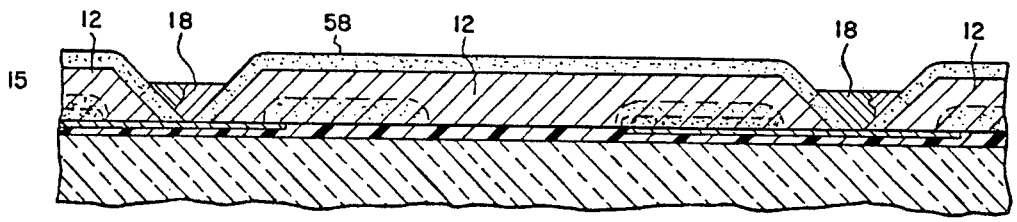

Next, the polycrystalline layer 60 is subjected to an etch solution which selectively attacks silicon at a fast rate and silicon dioxide at a very slow rate. For example, the etch solution may comprise a mixture of hydrofluoric acid, nitric acid and acetic acid. The structure is removed from the etch solution before all of the layer 60 has been removed so as to leave the polycrystalline material 18 as illustrated in FIG. 7. The silicon dioxide layer 58 protects the mesas 12 from the silicon etch solution. Next, the structure is subjected to an etch solution which selectively attacks the silicon dioxide layer 58, but not silicon, to leave the final structure illustrated in FIG. 8. The etch solution for the oxide may comprise a mixture of hydrofluoric acid and acetic acid. It is necessary to remove the silicon dioxide layer 58 over the top surfaces of the mesas 12 because the relatively low thermal conductance of the silicon dioxide impedes heat from being transferred to a sheet of paper disposed adjacent the mesas 12.

The only step of the method illustrated in FIGS. 2–8 that is difficult to control is the step of etching the polycrystalline silicon layer 60 in a manner to leave the material 18. This requires relatively close attention in order to assure that the correct amount of polycrystalline 18 is left in the moats. An alternative method for fabricating the device 10 which is more suited to mass production is illustrated in FIGS. 9–19.

Figure 2:
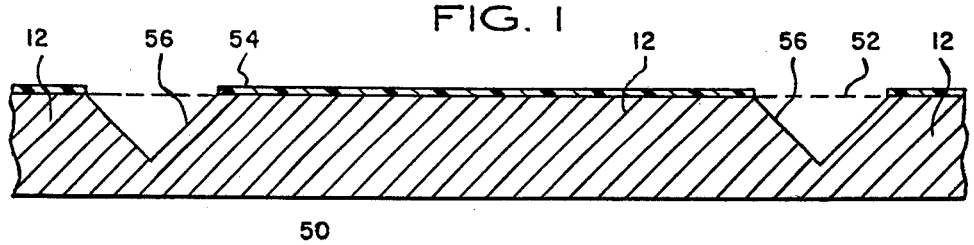
FIGS. 2–8 illustrate successive steps in the method of the present invention for fabricating the device of FIG. 1.
Figure 9:
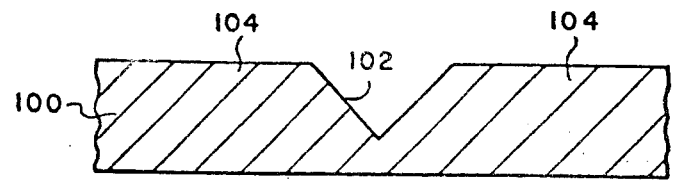
FIGS. 9–19 illustrate successive steps in an alternative method in accordance with the present invention for fabricating the thermal display device of FIG. 1.
Figure 10:
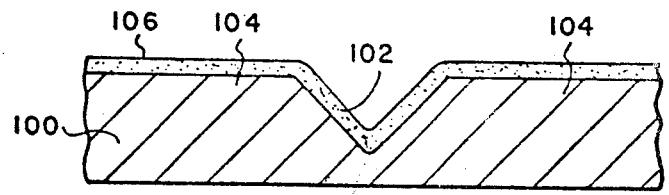

As illustrated in FIG. 9, the slice of silicon 100 is etched in a grid shaped pattern to provide a series of moats 102 and mesas 104 as heretofore described in connection with FIG. 2. A thick layer of silicon dioxide 106 is then grown on the surface of the slice 100 using conventional processes as heretofore described in connection with FIG. 3.

Figure 11:
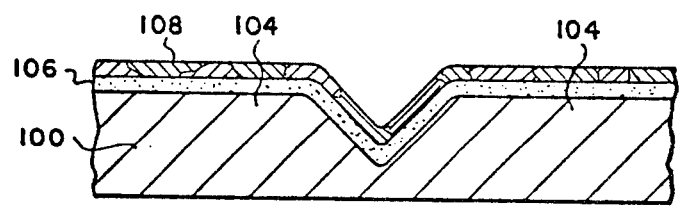

Next, a layer of polycrystalline silicon 108 is deposited on the silicon dioxide layer 106 as illustrated in FIG. 11. The thickness of layer 108 is determined by the amount of silicon which it is desired to leave in the moats. A compromise is required in selecting the thickness of layer 108. If the layer is too thin, the monolithic structure will not be sufficiently strong. If the layer 108 is too thick, too much heat will be transferred to the adjacent mesas. A layer 108 of polycrystalline silicon about 50,000 Angstrom units thick has been found appropriate.

Figure 12:
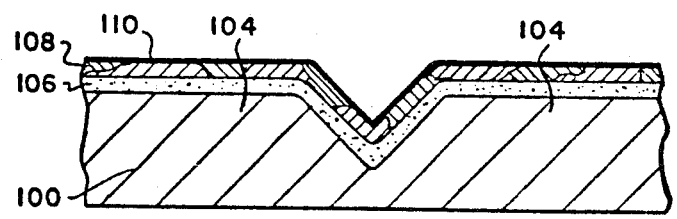
Figure 13:
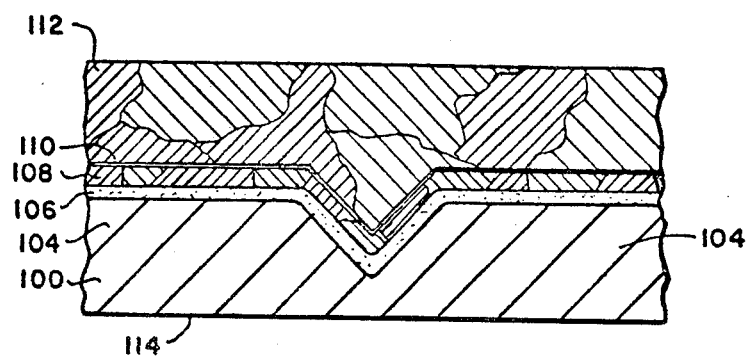
Figure 14:
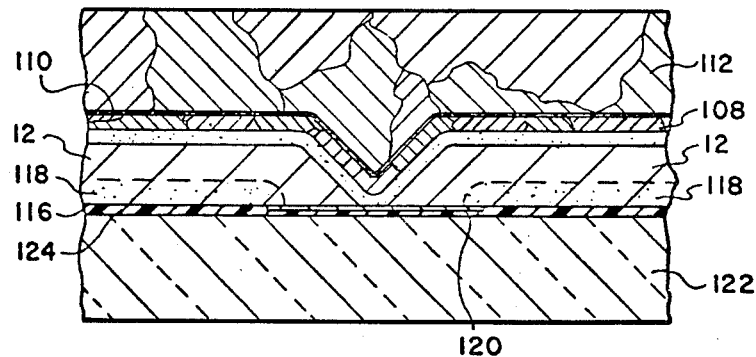

Next, a relatively thin layer of silicon dioxide 110, as illustrated in FIG. 12, is deposited to provide an etch stop, and a thick polycrystalline layer 112 is deposited on the thin silicon dioxide layer 110 as shown in FIG. 13 to produce a thick slice for further processing. This gives a thicker slice of approximately 17 mils which makes it easier to handle. The bottom surface 114 of the slice 100 is then lapped away to provide a new surface 116 as illustrated in FIG. 14. The heater transistors 118 and metallic leads 120 are then formed in the surface 116 of the mesas 12 using conventional integrated circuit processes. The surface 12 is then bonded to a ceramic substrate 122 by an epoxy layer 124 to provide the structure shown in FIG. 14.

The structure of FIG. 14 is then subjected to an etch which readily attacks silicon, but etches silicon dioxide only at a very slow rate. This removes the polycrystalline silicon layer 112 down to the thin silicon dioxide layer 110 and leaves the structure illustrated in FIG. 15. Because of the silicon dioxide layer 110, close attention to the etching procedure is not required to insure that the proper amount of polycrystalline silicon is left in the moats.

Figure 16:
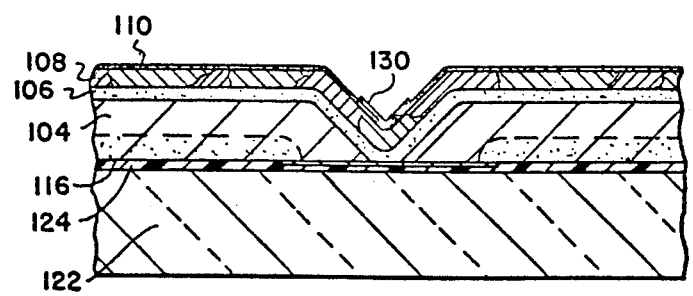
Figure 17:
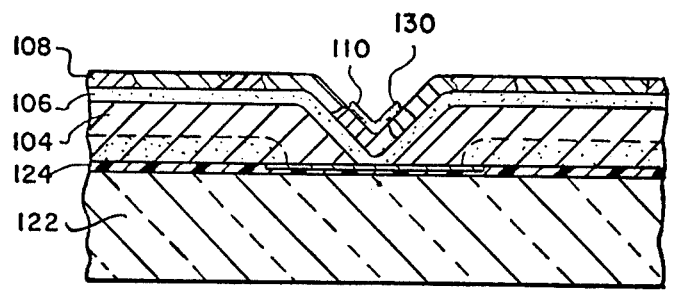
Figure 18:
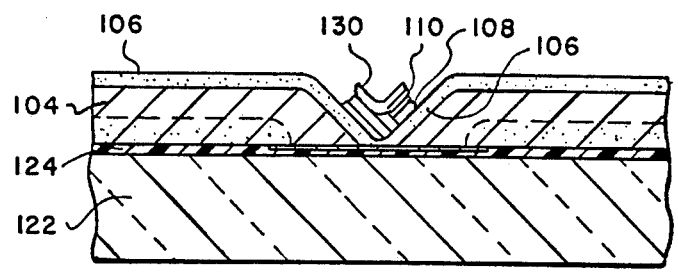
Figure 19:
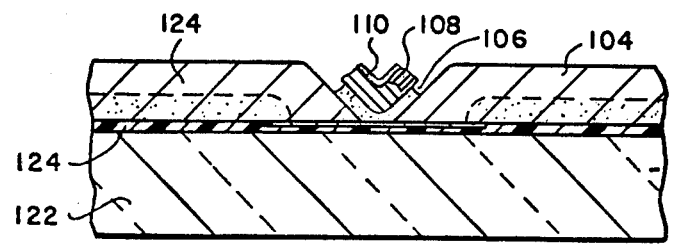

Next, a layer of photo-resist is deposited on the thin oxide layer 110 and patterned to leave photo-resist 130 on the oxide layer 110 lying within the moats. The structure of FIG. 16 is then subjected to an etch which selectively attacks silicon dioxide at a much greater rate than silicon, thus removing all of the thin silicon dioxide layer 110 except that illustrated in FIG. 17. At this point the photo-resist may or may not be stripped, depending upon whether it is desired to ultimately leave the oxide layer 110. The structure of FIG. 17 is then subjected to an etch which selectively removes the polycrystalline silicon layer 108 to leave the structure illustrated in FIG. 18. The structure is then subjected to an etch solution which selectively attacks the silicon dioxide layer 106 but not silicon. This removes the silicon dioxide layer 106 as illustrated in FIG. 19. If the photo-resist has not yet been removed, a portion of the thin oxide layer 110 will remain as shown in FIG. 19. FIG. 19 illustrates the completed device which has a grid of polycrystalline silicon 108 which is bonded to monocrystalline mesas 12 by a relatively thick layer 106 of silicon dioxide to form a monolithic slice which will resist thermal fracturing as heretofore described.

Figure 15:
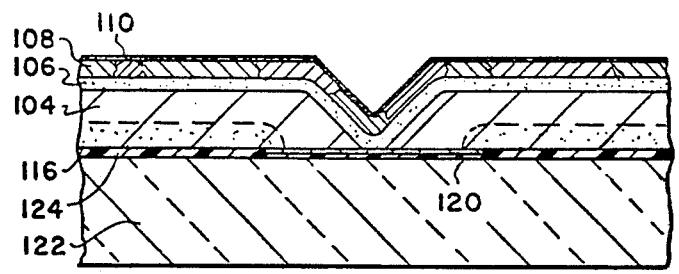
Figure 20:
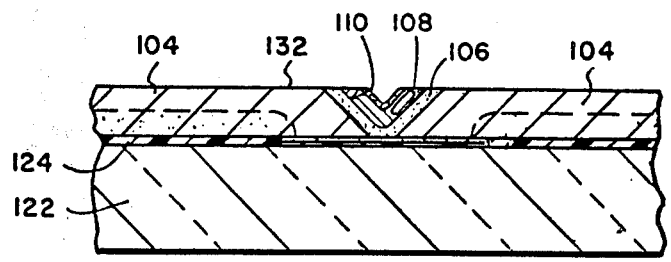
FIG. 20 illustrates an alternative step which may be substituted for the steps illustrated in FIGS. 15–19.

An alternative process which may be substituted for the steps illustrated in FIGS. 16–19 is illustrated in FIG. 20. In accordance with this process, the layers 110, 108 and 106 illustrated in the structure in FIG. 15 are ground away to surface 132 as shown in FIG. 20. This leaves a structure closely approximating that shown in FIG. 19 which functions in the same manner as heretofore described.

From the foregoing description of the method and product of the present invention, it will be appreciated that a substantially improved thermal display unit has been described. The monocrystalline semiconductor mesas are interconnected into a monolithic structure by the silicon dioxide and polycrystalline silicon disposed in the moats between the mesas. The relatively thick silicon dioxide layer provides sufficient thermal impedance between adjacent mesas to prevent thermal bleeding which would otherwise result if the polycrystalline silicon were used and the silicon dioxide were not present. Such bleeding results in blurred characters and often results in an inability to terminate conduction in adjacent mesas as a result of excess temperatures.

The polycrystalline silicon provides sufficient structural integrity under repeated differential thermal cycling to substantially eliminate thermal fractures. The polycrystalline silicon is also sufficiently durable to protect the conductors extending between the mesas 12 from mechanical abrasions when the thermal display unit is used as a thermal printer. The three materials in intimate contact form a monolithic sheet of material. The monocrystalline and polycrystalline silicon have relatively closely matched coefficients of thermal expansion which apparently contributes to the thermal stability of the monolithic structure.

Although preferred embodiments of the invention have been described in detail, it is to be understood that various changes, substitutions and alterations can be made therein without departing from the spirit and scope of the invention as defined by the appended claims.

What is claimed is:

1. The method for fabricating a thermal display device which comprises:
   selectively etching one face of a slice of monocrystalline semiconductor material to form a grid of moats and an array of mesas, the tops of said mesas lying substantially in a plane,
   growing a relatively thick layer of oxide on the slice, the oxide layer being sufficiently thin to not fill the moats,
   depositing a layer of polycrystalline semiconductor material on the oxide layer on said one face to provide a thick monolithic structure for processing,
   then removing monocrystalline semiconductor material from the face opposite said one face of the slice to the depth of the oxide layer in the moats,
   then forming circuit components in said mesas for converting said mesas into heat dissipating devices,
   then forming electrical conductors on said opposite face for contacting said circuit components,
   then mounting said device on an insulated substrate, and
   then removing only the polycrystalline semiconductor material and the layer of oxide overlying said plane while leaving sufficient polycrystalline semiconductor material and oxide in the moats to interconnect the mesas into a monolithic structure.

2. The method of claim 1 wherein all semiconductor material is silicon and the oxide is silicon dioxide.

3. The method of claim 1 wherein said step of removing only the polycrystalline semiconductor material and the layer of oxide comprises lapping the polycrystalline semiconductor material and the oxide layer.

4. The method of claim 1 wherein said step of depositing comprises the steps of:
   depositing a first relatively thin layer of polycrystalline semiconductor material of a predetermined thickness overlying said thick oxide so as not to fill said moats,
   forming a relatively thin second layer of oxide overlying said first polycrystalline layer such that said relatively thick and relatively thin oxide layers in combination with said first polycrystalline layer do not fill said moats,
   depositing a second relatively thick layer of polycrystalline semiconductor material overlying said second oxide layer to provide a thick monolithic structure for processing,
   and wherein said step of removing only the polycrystalline semiconductor material and the layer of oxide comprises the steps of:
   (i) selectively etching with a first solution the polycrystalline semiconductor material overlying the second layer of oxide,
   (ii) selectively removing the second oxide layer only above said plane by using a second selective etch solution which preferentially attacks the oxide layer as compared to the underlying semiconductor material,
   (iii) selectively removing said first layer of polycrystalline semiconductor material only above said plane by selectively etching to said first oxide layer, and
   (iv) selectively removing said relatively thick oxide layer only above said plane by etching to said mesas.

* * * * *